United States Patent
Schaepkens et al.

(10) Patent No.: US 8,236,424 B2
(45) Date of Patent: Aug. 7, 2012

(54) MULTILAYER COATING PACKAGE ON FLEXIBLE SUBSTRATES FOR ELECTRO-OPTICAL DEVICES

(75) Inventors: Marc Schaepkens, Ballston Lake, NY (US); Gregory Ronald Gillette, Clifton Park, NY (US); Charles Dominic Iacovangelo, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 782 days.

(21) Appl. No.: 12/352,386

(22) Filed: Jan. 12, 2009

(65) Prior Publication Data
US 2009/0202743 A1  Aug. 13, 2009

Related U.S. Application Data

(62) Division of application No. 10/439,506, filed on May 15, 2003, now abandoned.

(51) Int. Cl.
*C08G 63/00* (2006.01)
*C08G 63/02* (2006.01)
(52) U.S. Cl. ......... 428/412; 428/447; 428/500; 428/689
(58) Field of Classification Search .................. 428/412, 428/447, 500, 689
See application file for complete search history.

(56) References Cited

U.S. PATENT DOCUMENTS

| | | | |
|---|---|---|---|
| 4,871,580 A | 10/1989 | Schram | |
| 4,954,371 A | 9/1990 | Yializis | |
| 5,681,666 A | 10/1997 | Treger et al. | |
| 6,136,444 A | 10/2000 | Kon et al. | |
| 6,413,645 B1 | 7/2002 | Graff et al. | |
| 6,743,524 B2 | 6/2004 | Schaepkens | |
| 2002/0176993 A1 | 11/2002 | Graff et al. | |
| 2003/0022409 A1 | 1/2003 | Epstein | |
| 2003/0219632 A1 * | 11/2003 | Schaepkens | 428/698 |

FOREIGN PATENT DOCUMENTS
WO 01/18889 A 3/2001
* cited by examiner

*Primary Examiner* — Terressa Boykin
(74) *Attorney, Agent, or Firm* — Jean K. Testa

(57) ABSTRACT

An electro-optical device having at least one base and a multilayer coating surface disposed on at least one surface of the base. The at least one base may comprise either an optically or electronically active portion or a flexible polymeric material. The multilayer coating set comprises at least one organic layer and at least one inorganic layer. The base and multilayer coating set are transparent. The multilayer coating set provides a barrier to moisture and oxygen and provides chemical resistance. The multilayer coating set is also mechanically flexible and thermally stable up to a glass transition temperature of the base.

45 Claims, 3 Drawing Sheets

MULTILAYER COATING PACKAGE ON FLEXIBLE SUBSTRATES FOR ELECTRO-OPTICAL DEVICES

This application is a divisional application of and claims the priority benefit of U.S. application Ser. No. 10/439,506 filed May 15, 2003 now abandoned.

BACKGROUND OF INVENTION

The invention relates to an electro-optical device having a multilayer coating set. More particularly, the invention relates to a multilayer coating set that provides a moisture and gas barrier for the electro-optical device and enhances resistance of the electro-optical device to chemical attack.

Electro-optical devices, such as electrochromic devices, liquid crystal displays (also referred to hereinafter as "LCDs"), organic light emitting diodes (also referred to hereinafter as "OLEDs"), light emitting diodes (also referred to hereinafter as "LEDs"), photovoltaic devices, radiation detectors, and the like, comprise an electronically or optically active portion—e.g., liquid crystals, a light emitter, or radiation detector—that is frequently disposed on a substrate. In those applications where a rigid electro-optical device is either preferable or acceptable, either glass or silicon is generally used as the substrate. In those applications where a flexible electro-optical device is desired, a polymeric film may serve as the substrate. However, moisture and oxygen diffuse rapidly through such polymeric film substrates, thereby causing the performance of the electro-optical devices disposed on the substrate to degrade or even fail. In addition, polymeric substrates are also subject to attack by chemicals used during processing of the electro-optical device. Finally, many electro-optical applications require a substrate that is thermally stable and transparent in at least the visible light range.

Various single layer coatings have been used to modify the barrier properties of polymeric substrates for use in flexible electro-optical devices. A single layer coating, however, tends to provide a less than optimum barrier against moisture and oxygen. In addition, a single coating cannot meet all of the other requirements, such as mechanical, adhesion, electronically conductive, optical, thermal stability, chemical resistance, and thermal expansion criteria for such electro-optical devices. Multilayer coating composites comprising individually deposited layers have been used to provide the desired moisture and gas barrier properties for such electro-optical devices. However, such multilayer composites do not typically meet all of the other mechanical, adhesion, electric conductivity, optical absorption and/or reflectivity, thermal stability, and thermal expansion requirements for such electro-optical devices. The necessary combination of vacuum and wet processes complicates the manufacture of electro-optical devices that include such multilayer composites.

Therefore, what is needed is a multilayer coating set that provides a moisture and oxygen barrier and resistance to chemical attack during processing while simultaneously meeting the mechanical, adhesion, electronically conductive, optical, thermal stability, and thermal expansion requirements for electro-optical devices, such as LCDs, OLEDs, LEDs, photovoltaic devices, radiation detectors, and the like. What is also needed is a method of depositing such a multilayer coating set on a polymeric substrate using only vacuum-based deposition techniques. Finally, what is needed is an electro-optical device having such a multilayer coating set.

SUMMARY OF INVENTION

The present invention meets these and other needs by providing a transparent multilayer coating set comprising a moisture and oxygen barrier, a chemically resistant layer, and a transparent conductive coating. The invention also provides an electro-optical device comprising a polymeric substrate, a multilayer coating set, and an active portion. The multilayer coating set may be deposited using a single vacuum coating chamber.

Accordingly, one aspect of the invention is to provide an electro-optical device. The electro-optical device comprises: at least one base, the at least one base comprising a flexible polymeric material; and a multilayer coating set disposed on at least one surface of the base. The multilayer coating set comprises at least one organic layer and at least one inorganic layer. The base and multilayer coating set are transparent. The multilayer coating set provides a barrier to moisture and oxygen and provides chemical resistance. The multilayer coating set is also mechanically flexible and thermally stable up to a glass transition temperature of the base.

A second aspect of the invention is to provide a multilayer coating set for an electro-optical device. The multilayer coating set comprises: at least one inorganic layer; and at least one organic layer adjacent to said at least one inorganic layer. The multilayer coating set is transparent and is mechanically flexible and thermally stable. The multilayer coating set provides a barrier to moisture and oxygen for said electro-optical device, resistance to chemical attack for the electro-optical device and the base material during fabrication of the electro-optical device.

A third aspect of the invention is to provide an electro-optical device. The electro-optical device comprises at least one substrate. The substrate comprises: at least one base, wherein the at least one base comprising a flexible polymeric material; and a multilayer coating set comprising at least one inorganic layer and at least one organic layer adjacent to the at least one inorganic layer. The multilayer coating set is deposited on said at least one surface by a vacuum deposition technique. The multilayer coating set is transparent and is mechanically flexible and thermally stable up to a glass transition temperature of the base. The multilayer coating set provides a barrier to moisture and oxygen for said electro-optical device and resistance for the electro-optical device to chemical attack.

These and other aspects, advantages, and salient features of the present invention will become apparent from the following detailed description, the accompanying drawings, and the appended claims.

DETAILED DESCRIPTION

Figure 1:
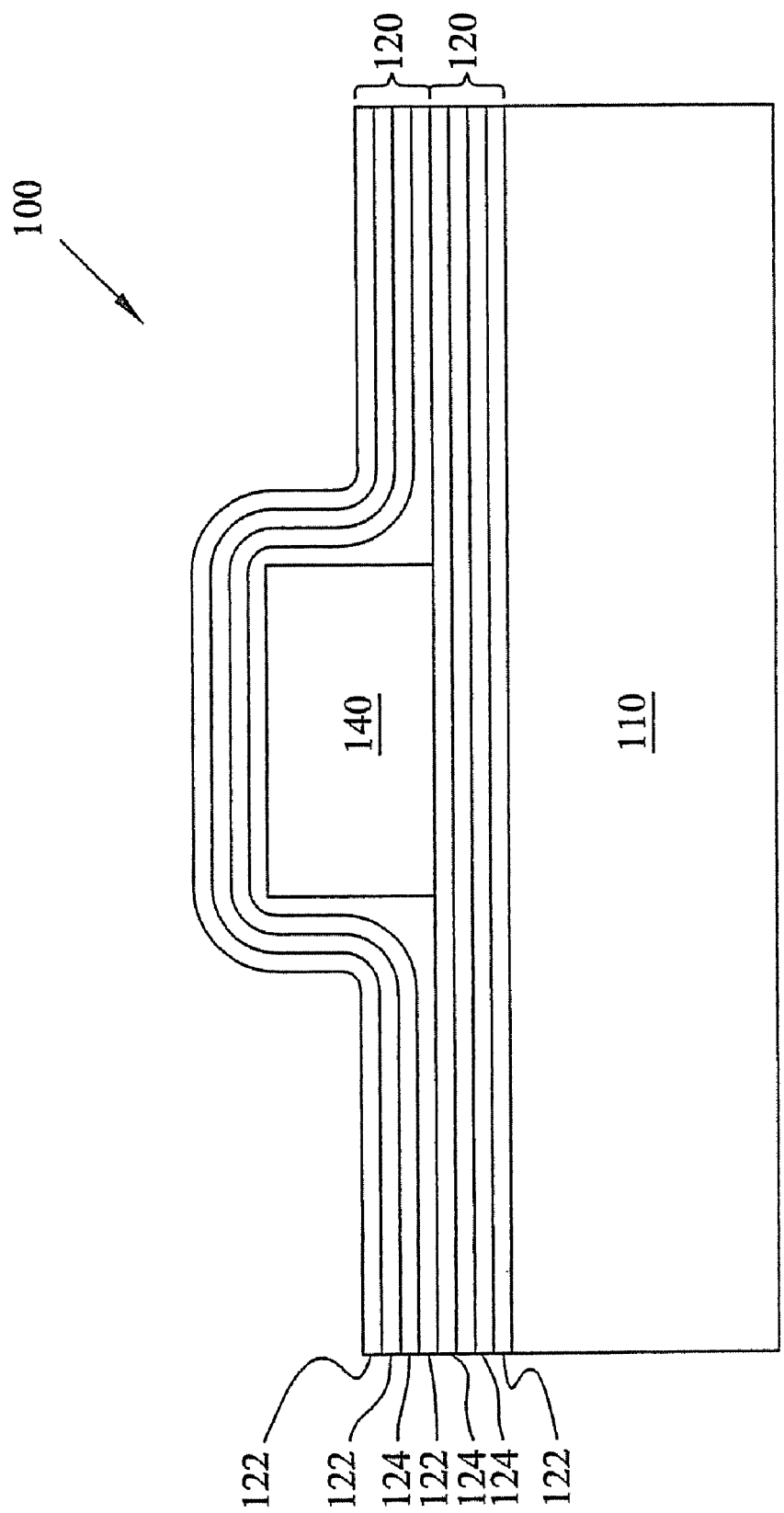
FIG. 1 is a schematic representation of an electro-optical device of the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Electro-optical devices, such as, but not limited to, electrochromic devices, liquid crystal displays (also referred to hereinafter as "LCDs"), organic light emitting diode (also referred to hereinafter as "OLEDs"), light emitting diodes (also referred to hereinafter as "LEDs"), photovoltaic devices, radiation detectors, and the like, comprise an electronically or optically active portion—e.g., liquid crystals, a light emitter, or radiation detector—that is frequently disposed on a substrate. In order to protect the active portion and the substrate from degradation due to exposure to moisture, oxygen, or corrosive chemical attack, the electro-optical device must include at least one barrier coating.

One aspect of the invention is to provide an electro-optical device, such as, but not limited to, LCDs, OLEDs, LEDs, photovoltaic devices, and radiation detectors. A schematic representation of such an electro-optical device is shown in FIG. 1. Electro-optical device 100 comprises at least one base 110, and at least one multilayer coating set 120 disposed on a surface of base 110. Both base 110 and multilayer coating set 120 are transparent to visible light. Base 110 and multilayer coating set may additionally be transparent in at least one of the infrared (IR) and ultraviolet (UV) regions of the spectrum. Multilayer coating set 120 acts as a barrier to prevent the exposure of active portion 140 of electro-optical device 100 to moisture and oxygen. Furthermore, multilayer coating set 120 acts as a barrier to chemical attack of the underlying polymeric base 110 during processing or manufacture of electro-optical device 100. Multilayer coating set 120 is also mechanically flexible. The flexibility of multilayer coating set 120 allows it to adhere and conform to the shape of base 110 during processing and in the final configuration of electro-optical device 100.

Base 110 may comprise at least one of a substrate and an active portion 140 of electro-optical device 100. In one embodiment, base 110 comprises a substrate, which is formed from a flexible polymeric material. In one particular embodiment, the flexible polymeric material comprises a polycarbonate. In another embodiment, shown in FIG. 1, active portion 140 is encapsulated by a first multilayer coating set 120, which provides a barrier between base 110 and active portion 140, and a second multilayer coating set 120, which provides an additional barrier for the remainder of active portion 140.

Multilayer coating set 120 may be disposed upon on at least one surface of a base material, such as, but not limited to, a base 110 or the active portion 140 of electro-optical device 100. Multilayer coating set 120 comprises at least on inorganic layer 122 and at least one organic layer 124. The multilayer coating set 120 may include a plurality of inorganic layer 122 and organic layers 124 that are alternately arranged. Alternatively, organic layers 124 may be separated by a plurality of consecutively stacked inorganic layers 122, or inorganic layers 122 may be separated by a plurality of consecutively stacked organic layers 124.

In one embodiment, multilayer coating set 120 comprises an inorganic multilayer coating and at least one organic layer. A first inorganic layer having good adhesion and coefficient of thermal expansion (CTE) matching properties is deposited on a smooth polycarbonate surface. A second inorganic layer having intrinsically good gas and moisture barrier properties is deposited on the first inorganic layer. The second inorganic layer differs chemically and physically from the first inorganic layer. The adhesion and CTE matching properties of the first inorganic layer also serve to increase the barrier performance of the second inorganic layer. A polymeric organic layer is next deposited on top of the second inorganic layer. The polymeric organic layer acts as a smoothing layer and also protects the first and second inorganic coatings from chemical attack during processing. A third inorganic layer having good adhesion and CTE matching properties is then deposited on top of the organic layer. Finally, a fourth inorganic layer having intrinsically good gas and moisture barrier properties is deposited on top of the third inorganic layer. The fourth inorganic layer differs chemically and physically from the third inorganic layer. The barrier properties of the fourth inorganic layer are enhanced by adhesion and CTE matching properties of the third inorganic layer. In addition to simultaneously optimizing barrier and adhesion performance, multilayer coating set 120 may be designed to simultaneously meet demands on thermal, mechanical, dimensional, and optical performance.

Multilayer coating set 120 is transparent to light in the visible portion of the spectrum. In one embodiment, multilayer coating set 120 has a transmission of at least about 85% and a Taber haze value of less than about 5% after 1000 cycles.

Multilayer coating set 120 additionally provides a barrier for base 110 against chemical attack during processing. Multilayer coating set 120 may include at least one chemically resistant layer that is resistant to attack by at least one of alkali solutions (non-limiting examples include KOH and NaOH), acids (non-limiting examples include HBr, HCl, and HNO3), and organic solvents, such as but not limited to xylene, NMP, acetone, and the like.

Multilayer coating set 120 is also thermally stable up to at least a glass transition temperature of base 110. When, for example, multilayer coating set 120 is disposed on a polycarbonate substrate having a glass transition temperature of about 250° C., multilayer coating set 120 is thermally stable up to at least about 250° C. In addition, multilayer coating set 100 is mechanically flexible; i.e., multilayer coating set 120 can be bent around a radius of about 1 inch (2.54 cm) without exhibiting a substantial degradation in overall performance as a barrier against moisture, gas, and chemical attack.

Each of the at least one inorganic layer 122 may comprise at least one of silicon, a metal oxide, a metal nitride, and combinations thereof, wherein the metal is one of indium, tin, zinc, titanium, and aluminum. Non-limiting examples of metal nitrides and metal oxides that may comprise the at least one inorganic layer 122 include indium zinc oxide (IZO), indium tin oxide (ITO), silicon oxide, silicon nitride, silicon oxynitride, aluminum oxide, aluminum oxynitride, zinc oxide, indium oxide, tin oxide, cadmium tin oxide, cadmium oxide, and magnesium oxide.

The at least one inorganic layer 122 may, in one embodiment, be deposited on either base material 110 or organic layer 124 by vacuum deposition techniques known in the art. Such vacuum deposition techniques include physical vapor deposition or plasma deposition methods. Plasma based deposition methods are particularly preferred, as they typically permit deposition of the at least one inorganic layer 122 at low substrate temperatures. The deposition of the at least one inorganic layer 122 by other techniques, such as thermal chemical vapor deposition (CVD) requires substrate temperatures that are higher than those at which plastic substrates are thermally stable. Plasma deposition methods that may be used to deposit the at least one inorganic layer 122 include, but are not limited to, plasma enhanced chemical vapor deposition, expanding thermal plasma, microwave plasma, inductively coupled plasma, and high density plasma chemical vapor deposition. Physical vapor deposition methods that may be used to deposit the at least one inorganic layer 122 include, but are not limited to, sputtering, laser ablation, cathodic arc deposition, and electron beam evaporation. The above-referenced plasma and physical vapor deposition techniques may be used either alone or in combination with each other.

The at least one inorganic layer 122 serves as at least one of a radiation absorbent layer, a moisture barrier layer, an oxygen barrier layer, an electrically conductive layer, an anti-reflective layer, and combinations thereof. In one embodiment, the at least one inorganic layer 122 serves as a moisture barrier layer having a water vapor transmission rate of less than 0.1 g/m$^2$-day at 100% relative humidity and 25° C. The at least one inorganic layer 122 may also serve as an oxygen barrier layer, which, in one embodiment, has an oxygen transmission rate of less than 0.1 cc/m$^2$ day for oxygen diffusion in a 21% oxygen atmosphere at 25° C.

Each of the at least one organic layer 124 comprises at least one of a parylene, an acrylic, a siloxane, xylene, an alkene, styrene, an organosilane, an organosilazane, an organosilicone, and the like. The at least one organic layer 124 includes at least one of an adhesion layer, a stress relief layer, a conformal layer, a chemically resistant layer, an abrasion resistant layer, and combinations thereof.

The at least one organic layer 124 may be deposited on either base material 110 or inorganic layer 122 by vacuum deposition techniques known in the art. Such vacuum deposition techniques include physical vapor deposition or plasma deposition methods. Organic layer 124 may also be deposited using polymer monolithic layer (also referred to hereinafter as "PML") deposition methods that are known in the art. One such PML method includes the steps of: flash evaporation of at least one radiation-curable monomer, such as, but not limited to acrylic monomers, vinyl monomers, epoxy monomers, and the like; condensing the at least one radiation-curable monomer on one of base material 110, the at least one inorganic layer 122, or another organic layer 124; and radiation cross-linking the at least one radiation-curable monomer by irradiation by one of at least one electron beam or ultraviolet radiation to form the at least one organic layer 124. PML deposition is carried out in a vacuum and thus produces organic layers having fewer defects, such as pinholes, due to dust than deposition methods such as spin coating, meniscus coating, dip coating, and extrusion coating, that are performed under atmospheric conditions organic coating techniques. PML methods that may be used to deposit the at least one organic layer 124 are described in U.S. Pat. No. 4,954,371, by Angelo Yializis, entitled "Flash Evaporation of Monomer Fluids," the contents of which are incorporated herein by reference in their entirety. Plasma deposition methods that may be used to deposit the at least one organic layer 124 include, but are not limited to: plasma enhanced chemical vapor deposition; expanding thermal plasma, described in U.S. Pat. No. 4,871,580, by Daniel C. Schram and Gerardus M. W. Kroesen, entitled "Method of Treating Surfaces of Substrates with the Aid of a Plasma," the contents of which are incorporated herein by reference in their entirety; microwave plasma; inductively coupled plasma; and high density plasma chemical vapor deposition. Among the materials that can be deposited by physical vapor deposition are fluorocarbons and hydrocarbons. Physical vapor deposition methods that may be used to deposit the at least one organic layer 124 include, but are not limited to, sputtering, laser ablation, and electron beam evaporation. The above-referenced deposition techniques may be used either alone or in combination with each other.

Multilayer coating set 120 has a thickness in the range from about 0.05 micron to about 50 microns. In one embodiment, the thickness of multilayer coating set 120 is in the range from about 0.1 micron to about 10 microns. The thickness of the individual layers in multilayer coating set 120 must be balanced to optimize performance of individual layers while maximizing the multilayer adhesion and flexibility of multilayer coating set 120. The thickness of the individual layers also depends in part on the function of and the material comprising the individual layer. For example, an ultraviolet absorbing titanium oxide may have a thickness of about 0.2 micron. An inorganic barrier layer may have a thickness ranging from about 20 nm to about 200 nm. PML chemical barrier layers or smoothing/bond layers have thicknesses in a range from about 0.1 micron to about 4 microns.

Figure 2:
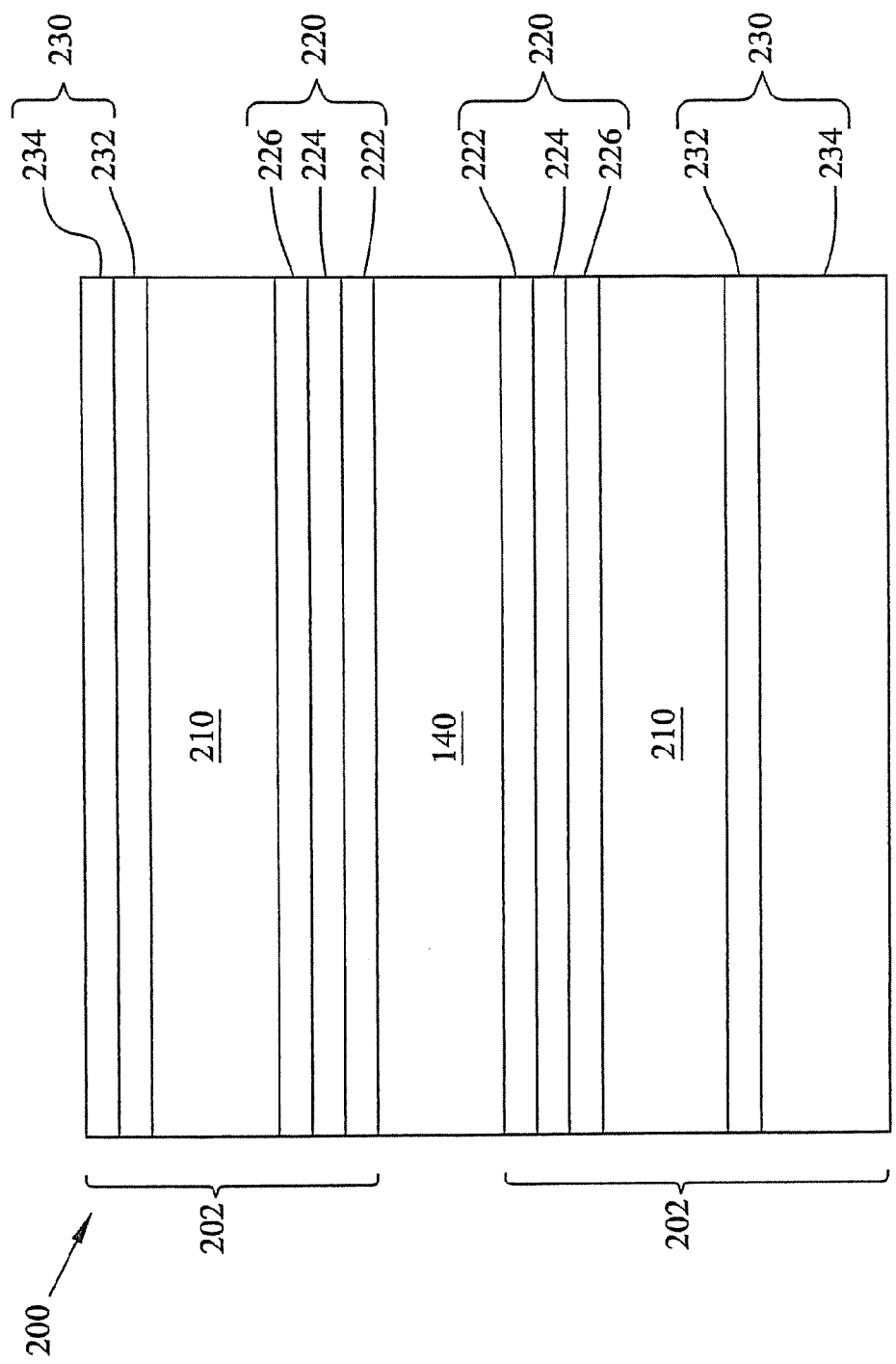
FIG. 2 is a schematic representation of a first LCD substrate structure of the present invention.
Figure 3:
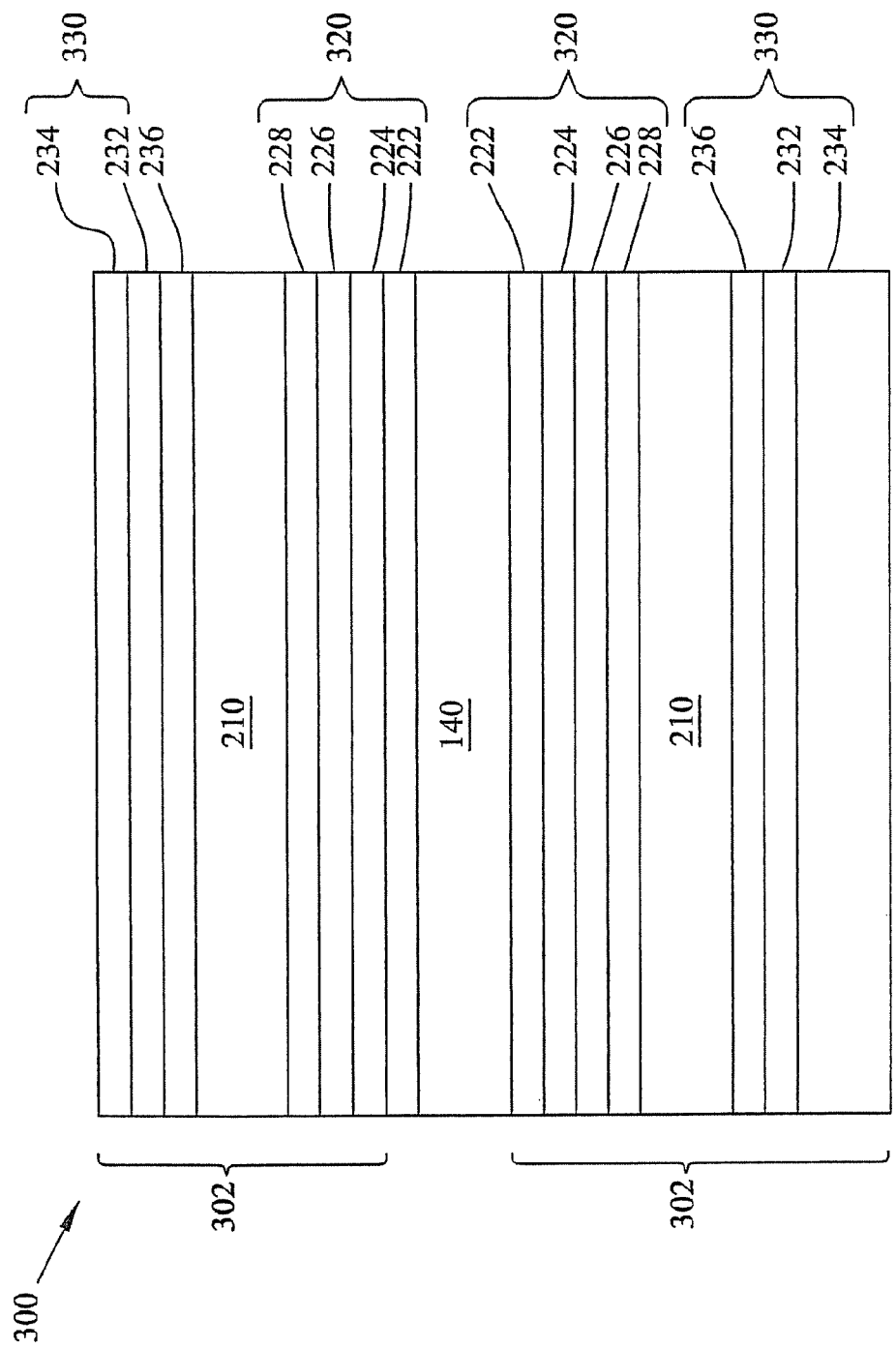
FIG. 3 is a schematic representation of a second LCD substrate structure of the present invention.

One example of an electro-optical device 100 of the present invention is a liquid crystal (LCD) display. A LCD display typically includes an active layer 140 comprising a liquid crystal suspension sandwiched between two LCD substrate structures. Two such LCD substrate structures are shown in FIGS. 2 and 3. In FIG. 2, substrate structure 202 comprises a polycarbonate substrate 210, an inner multilayer coating set 220, and an outer multilayer coating set 230.

In FIG. 2, inner multilayer coating set 220 is disposed between substrate 210 and active portion 140, and comprises an inorganic moisture and oxygen barrier layer 226, an organic chemical barrier layer 224, and a transparent conductive inorganic layer 222. Inorganic moisture and oxygen barrier layer 226 may be deposited by sputtering and, in one embodiment, has a thickness ranging from about 20 nm to about 200 nm and comprises indium tin oxide (ITO). Alternatively, other inorganic oxides, nitrides, or oxynitrides, such as, but not limited to, silicon oxides, nitrides, and oxynitrides, and aluminum oxides, nitrides, and oxynitrides may be used to form inorganic moisture and oxygen barrier layer 226. Organic chemical barrier layer 224, which is deposited by PML processing, provided resistance against chemical attack by most chemicals commonly used in display manufacturing. Organic chemical barrier layer 224 has a thickness ranging from about 0.1 micron to about 4 microns. Conductive inorganic layer 222 may be deposited by sputtering and, in one embodiment, has a thickness of about 125 nm and comprised indium tin oxide indium oxide doped with 2-15% tin, is then deposited directly onto inner organic chemical barrier layer 224 using a sputtering process to complete inner multilayer coating set 220.

LCD substrate structure 202 is prepared in an apparatus having a vacuum chamber that can be pumped down to pressures below $10^{-4}$ torr, and, preferably, less than $10^{-6}$ torr. The vacuum chamber contains at least one sputtering deposition station and at least one of a flash evaporator and an electron beam system. Polycarbonate substrate 210 is placed within the vacuum chamber, which is then evacuated to a pressure below $10^{-4}$ torr and, preferably, less than $10^{-6}$ torr. In one embodiment, substrate 210 contacts a chilled drum that can be rotated to move polycarbonate substrate 210 from one deposition station to another.

An outer surface of polycarbonate substrate 210 is first treated with at least one of a plasma, an ion beam, or an electron beam to accelerate outgassing of moisture and to remove low molecular weight species. Outer inorganic moisture and oxygen barrier layer 232 is first deposited on the outer surface of the polycarbonate substrate 110 through a sputtering process. Using the PML process, outer organic chemical barrier layer 234 is then deposited directly onto the outer surface of outer inorganic moisture and oxygen barrier layer 232 to complete outer multilayer coating set 230.

Inner multilayer coating set 220 is then prepared by first treating an inner surface of polycarbonate substrate 210 with at least one of a plasma, an ion beam, or an electron beam to accelerate outgassing of moisture and to remove low molecular weight species. Inner inorganic moisture and oxygen barrier layer 226 is first deposited on the outer surface of the polycarbonate substrate 210 through a sputtering process.

Using the PML process, inner organic chemical barrier layer 224 is then deposited directly onto the outer surface of inner inorganic moisture and oxygen barrier layer 226. Conductive inorganic layer 222, typically comprising indium oxide doped with 2-15% tin, is then deposited directly onto inner organic chemical, barrier layer 224 using a sputtering process to complete inner multilayer coating set 220.

FIG. 3 is a schematic representation of a second LCD substrate structure 302. In addition to inner inorganic moisture and oxygen barrier layer 226, inner organic chemical barrier layer 224, and conductive inorganic layer 222, inner multilayer coating set 320 further includes an inner organic smoothing/bond layer 228 disposed between substrate 210 and inner inorganic moisture and oxygen barrier layer 226. Outer multilayer coating set 330 also includes an outer organic smoothing/bond layer 236 disposed between substrate 210 and outer inorganic moisture and oxygen barrier layer 232, and an outer organic chemical barrier layer 234 disposed on an outer surface of outer surface of outer inorganic moisture and oxygen barrier layer 232. Inner and outer organic smoothing/bond layers 228, 236 promotes bonding and adhesion of both inner multilayer coating set 320 and outer multilayer coating set 330, respectively, to 210 substrate and decrease the degree of roughness of the interface between the multilayer coating sets and substrate 210. Each of outer and inner organic smoothing/bond layers 228, 236 is deposited by PML processing and has a thickness ranging from about 0.1 micron to about 4 microns.

LCD substrate structure 302 is prepared in the same apparatus as that used to prepare LCD substrate structure 202. An outer surface of polycarbonate substrate 210 is first treated with at least one of a plasma, an ion beam, or an electron beam to accelerate outgassing of moisture and to remove low molecular weight species. Outer organic bonding/smoothing layer 236 is then deposited on an outer surface of polycarbonate substrate 210 using a PML process. Outer inorganic moisture and oxygen barrier layer 232 is then deposited on outer organic bonding/smoothing layer 236 using a sputtering process. Using the PML process, outer organic chemical barrier layer 234 is then deposited directly onto the outer surface of outer inorganic moisture and oxygen barrier layer 232 to complete outer multilayer coating set 330.

Inner multilayer coating set 320 is then prepared by first treating an inner surface of polycarbonate substrate 210 with at least one of a plasma, an ion beam, or an electron beam to accelerate outgassing of moisture and to remove low molecular weight species. Inner organic bonding/smoothing layer 228 is then deposited on an outer surface of polycarbonate substrate 210 using a PML process. Next, inner inorganic moisture and oxygen barrier layer 226 is deposited on inner organic bonding/smoothing layer 236 using a sputtering process. Using the PML process, inner organic chemical barrier layer 224 is then deposited directly onto the outer surface of inner inorganic moisture and oxygen barrier layer 226. Conductive inorganic layer 222, typically comprising indium oxide doped with between about 2 weight percent and about 15 weight percent tin, is then deposited directly onto inner organic chemical barrier layer 224 using a sputtering process to complete inner multilayer coating set 320.

Another aspect of the invention is to provide a multilayer coating set for an electro-optical device. The multilayer coating set comprises at least one inorganic layer and at least one organic layer adjacent to the at least one inorganic layer. The multilayer coating set is transparent, mechanically flexible, and thermally stable. The multilayer coating set provides a barrier to moisture and oxygen for the electro-optical device, resistance to chemical attack for the electro-optical device and a base or substrate material during fabrication of the electro-optical device. The multilayer coating set 120, which is transparent and comprises at least one inorganic layer and at least one organic layer, is described in detail hereinabove.

The multiple layers of multilayer coating set 120 are deposited such that the various barrier properties, chemical resistance, mechanical, adhesion, electronically conductive, optical, thermal stability, and thermal expansion requirements can be independently optimized. Because the various layers are deposited using vacuum deposition techniques, the individual layers of multilayer coating set 120 have fewer defects than corresponding coatings that are produced using either wet or atmospheric coating processes.

While typical embodiments have been set forth for the purpose of illustration, the foregoing description should not be deemed to be a limitation on the scope of the invention. In one embodiment, for example, the barrier layer may have a hybrid inorganic/organic composition comprising either be multilayer barrier of discrete organic and inorganic layers or a single barrier layer having a graded composition that gradually transitions from a pure inorganic layer to a pure organic layer. Accordingly, various modifications, adaptations, and alternatives may occur to one skilled in the art without departing from the spirit and scope of the present invention.

The invention claimed is:

1. A method of making a device comprising the steps of:
providing a base having at least one surface, the base comprising a flexible polymeric material; and
placing a multilayer coating on at least one surface the base, the coating comprising at least one organic layer and at least one inorganic layer,
wherein the coating provides a barrier to moisture and oxygen and provides chemical resistance, and
wherein the organic layer is deposited by one of plasma enhanced chemical vapor deposition, expanding thermal plasma, microwave plasma, inductively coupled plasma, and high density plasma chemical vapor deposition.

2. The method of claim 1 wherein the organic layer is deposited by one of sputtering, laser ablation, cathodic arc deposition, and electron beam evaporation.

3. The method of claim 1 wherein the multilayer coating is deposited by a vacuum deposition technique.

4. The method of claim 3 wherein the inorganic layer is deposited by one of plasma deposition and physical vapor deposition.

5. The method of claim 4 wherein the inorganic layer is deposited by one of plasma enhanced chemical vapor deposition, expanding thermal plasma, microwave plasma, inductively coupled plasma, and high density plasma chemical vapor deposition.

6. The method of claim 4 wherein the inorganic layer is deposited by one of sputtering, laser ablation, cathodic arc deposition, and electron beam evaporation.

7. The method of claim 4 wherein the organic layer is deposited by one of plasma deposition, physical vapor deposition, and polymer monolithic layer deposition.

8. The method of claim 1 wherein the flexible polymeric material comprises a polycarbonate.

9. The method of claim 1 wherein the organic layer comprises at least one of a parylene, an acrylic, a siloxane, xylene, an alkene, styrene, an organosilane, an organosilazane, and an organosilicone.

10. The method of claim 1 wherein the organic layer includes at least one of an adhesion layer, a stress relief layer, a conformal layer, a chemically resistant layer, an abrasion resistance layer, and combinations thereof.

11. The method of claim 10 wherein the chemically resistant layer is resistant to at least one of alkali solutions, acids, and organic solvents.

12. The method of claim 1 wherein the inorganic layer comprises at least one of a metal oxide, a metal nitride, silicon oxide, silicon nitride, and combinations thereof.

13. The method of claim 12 wherein the inorganic layer comprises at least one of indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, and magnesium oxide.

14. The method of claim 1 wherein the inorganic layer includes at least one of an ultraviolet radiation absorbent layer, an infrared radiation absorbent layer, a barrier layer, an electrically conductive layer, an anti-reflective layer, and combinations thereof.

15. The method of claim 14 wherein the barrier layer is a moisture barrier layer having a water vapor transmission rate of less than 0.1 g/m$^2$-day at 100% relative humidity and 35° C.

16. The method of claim 14 wherein the barrier layer is an oxygen barrier layer having an oxygen transmission rate of less than 0.1 cc/m$^2$-day for oxygen diffusion in a 21% oxygen atmosphere at 25° C.

17. The method of claim 1 wherein the coating has a thickness from about 0.05 microns to about 50 microns.

18. The method of claim 1 wherein the coating has a thickness from about 0.1 micron to about 10 microns.

19. The method of claim 1 wherein the device is an electro-optical device and is one of an electrochromic device, a liquid crystal display, an organic light emitting diode, a light emitting diode, a photovoltaic device, and an x-ray detector.

20. The method of claim 1 wherein the coating further includes a transparent inorganic conductive layer.

21. The method of claim 20 wherein the transparent inorganic conductive layer comprises indium tin oxide.

22. The method of claim 1 wherein at least one of the base and the coating are transparent.

23. The method of claim 1 wherein the coating is mechanically flexible and thermally stable up to a glass transition temperature of the base.

24. A method of making a multilayer coating for an electro-optical device comprising the steps of:
providing at least one inorganic layer; and
providing at least one organic layer adjacent to the inorganic layer,
wherein the coating provides a barrier to moisture and oxygen for the electro-optical device; and
wherein the organic layer is deposited by one of plasma enhanced chemical vapor deposition, expanding thermal plasma, microwave plasma, inductively coupled plasma, and high density plasma chemical vapor deposition.

25. The method of claim 24 wherein the organic layer is deposited by one of sputtering, laser ablation, cathodic arc deposition, and electron beam evaporation.

26. The method of claim 24 wherein the multilayer coating is deposited by a vacuum deposition technique.

27. The method of claim 26 wherein the inorganic layer is deposited by one of plasma deposition and physical vapor deposition.

28. The method of claim 27 wherein the inorganic layer is deposited by one of plasma enhanced chemical vapor deposition, expanding thermal plasma, microwave plasma, inductively coupled plasma, and high density plasma chemical vapor deposition.

29. The method of claim 27 wherein the inorganic layer is deposited by one of sputtering, laser ablation, cathodic arc deposition, and electron beam evaporation.

30. The method of claim 27 wherein the organic layer is deposited by one of plasma deposition, physical vapor deposition, and polymer monolithic layer deposition.

31. The method of claim 24 wherein the flexible polymeric material comprises a polycarbonate.

32. The method of claim 24 wherein the organic layer comprises at least one of a parylene, an acrylic, a siloxane, xylene, an alkene, styrene, an organosilane, an organosilazane, and an organosilicone.

33. The method of claim 24 wherein the organic layer includes at least one of an adhesion layer, a stress relief layer, a conformal layer, a chemically resistant layer, an abrasion resistance layer, and combinations thereof.

34. The method of claim 33 wherein the chemically resistant layer is resistant to at least one of alkali solutions, acids, and organic solvents.

35. The method of claim 24 wherein the inorganic layer comprises at least one of a metal oxide, a metal nitride, silicon oxide, silicon nitride, and combinations thereof.

36. The method of claim 35 wherein the inorganic layer comprises at least one of indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, and magnesium oxide.

37. The method of claim 24 wherein the inorganic layer includes at least one of an ultraviolet radiation absorbent layer, an infrared radiation absorbent layer, a barrier layer, an electrically conductive layer, an anti-reflective layer, and combinations thereof.

38. The method of claim 37 wherein the barrier layer is a moisture barrier layer having a water vapor transmission rate of less than 0.1 g/m$^2$-day at 100% relative humidity and 35° C.

39. The method of claim 37 wherein the barrier layer is an oxygen barrier layer having an oxygen transmission rate of less than 0.1 cc/m$^2$-day for oxygen diffusion in a 21% oxygen atmosphere at 25° C.

40. The method of claim 24 wherein the coating has a thickness from about 0.05 microns to about 50 microns.

41. The method of claim 24 wherein the coating has a thickness from about 0.1 micron to about 10 microns.

42. The method of claim 24 wherein the device is an electro-optical device and is one of an electrochromic device, a liquid crystal display, an organic light emitting diode, a light emitting diode, a photovoltaic device, and an x-ray detector.

43. The method of claim 24 wherein the coating further includes a transparent inorganic conductive layer.

44. The method of claim 43 wherein the transparent inorganic conductive layer comprises indium tin oxide.

45. The method of claim 24 wherein at least one of the base and the coating are transparent.

* * * * *